(12) United States Patent
Korpi et al.

(10) Patent No.: US 7,816,954 B2
(45) Date of Patent: Oct. 19, 2010

(54) CIRCUIT CONFIGURATION OF A FREQUENCY DIVIDER

(75) Inventors: Petri J. Korpi, Kangasala (FI); Juha Hallivuori, Tampere (FI); Arttu Uusitalo, Ruutana (FI)

(73) Assignee: Nokia Corporation, Espoo (FI)

( * ) Notice: Subject to any disclaimer, the term of this patent is extended or adjusted under 35 U.S.C. 154(b) by 107 days.

(21) Appl. No.: 11/987,630

(22) Filed: Dec. 3, 2007

(65) Prior Publication Data
US 2009/0091361 A1    Apr. 9, 2009

(30) Foreign Application Priority Data
Oct. 9, 2007    (FI) ................................. 20075715

(51) Int. Cl.
*H03B 19/00* (2006.01)
(52) U.S. Cl. ...................... 327/117; 327/113; 327/114; 327/115; 327/116
(58) Field of Classification Search ......... 327/113–115, 327/117–118
See application file for complete search history.

(56) References Cited

U.S. PATENT DOCUMENTS

| | | | |
|---|---|---|---|
| 6,489,818 B2 * | 12/2002 | Vaucher et al. | 327/117 |
| 7,412,216 B2 * | 8/2008 | Bristow | 455/127.2 |
| 2006/0119446 A1 * | 6/2006 | Li | 331/74 |
| 2007/0132515 A1 | 6/2007 | Lee et al. | |

FOREIGN PATENT DOCUMENTS

WO    WO 2005/093954 A1    10/2005

OTHER PUBLICATIONS

International Search Report, PCTFI2008/05061 dated Feb. 12, 2009.

* cited by examiner

*Primary Examiner*—Lincoln Donovan
*Assistant Examiner*—John W Poos
(74) *Attorney, Agent, or Firm*—Squire, Sanders & Dempsey L.L.P.

(57) ABSTRACT

A frequency divider including at least one frequency divider cell having an adjustable circuit configuration which may be selected adaptively according to properties of an oscillator signal to be frequency-divided in the frequency divider. Accordingly, the circuit configuration of the frequency divider may be changed on the fly during the operation.

24 Claims, 6 Drawing Sheets

CIRCUIT CONFIGURATION OF A FREQUENCY DIVIDER

FIELD OF THE INVENTION

The invention relates to configuring a frequency divider for use in a radio transceiver.

BACKGROUND OF THE INVENTION

A typical frequency mixer implemented in a radio transceiver comprises an oscillator signal generation circuit (phase locked loop (PLL), for example) to provide an oscillator signal having a first frequency and one or more frequency dividers dividing the frequency of the oscillator signal output from the oscillator signal generation circuit to a desired frequency (or frequencies). The output signal of a selected frequency divider is then used for up-converting a transmission signal to a desired radio frequency and/or down-converting a reception signal from the radio frequency to a baseband or to an intermediate frequency band.

In current radio systems, the frequency divider used in the oscillator signal generation circuitry after a voltage-controlled oscillator (VCO) is designed to operate at certain frequency ranges and amplitudes specified by the system or by the properties of the VCO. The plans of the future multi-standard radio systems increase the operational frequency range of the divider and, thereby, requirements of the frequency divider. A conventional solution to ensure an adequate performance of the frequency divider is to increase the VCO output power, but that consumes power and is, therefore, not a preferable solution. Requirements for the operational frequency ranges of the frequency dividers may range within several GHz. The operation of the frequency divider on any given frequency within this range becomes a challenge, because maximum swing and minimum noise are required of the divider within the whole specified frequency range.

BRIEF DESCRIPTION OF THE INVENTION

An object of the invention is to provide a solution for configuring frequency divider during operation to achieve improved performance.

According to an aspect of the invention, there is provided a method according to claim 1.

According to another aspect of the invention, there are provided apparatuses according to claims 15 and 30.

According to another aspect of the invention, there is provided a radio apparatus according to claim 26.

According to another aspect of the invention, there is provided a computer program product embodied on a distribution medium according to claim 31.

BRIEF DESCRIPTION OF THE DRAWINGS

In the following, the invention will be described in greater detail with reference to the embodiments and the accompanying drawings, in which.

DETAILED DESCRIPTION OF THE PREFERRED EMBODIMENTS

Figure 1:
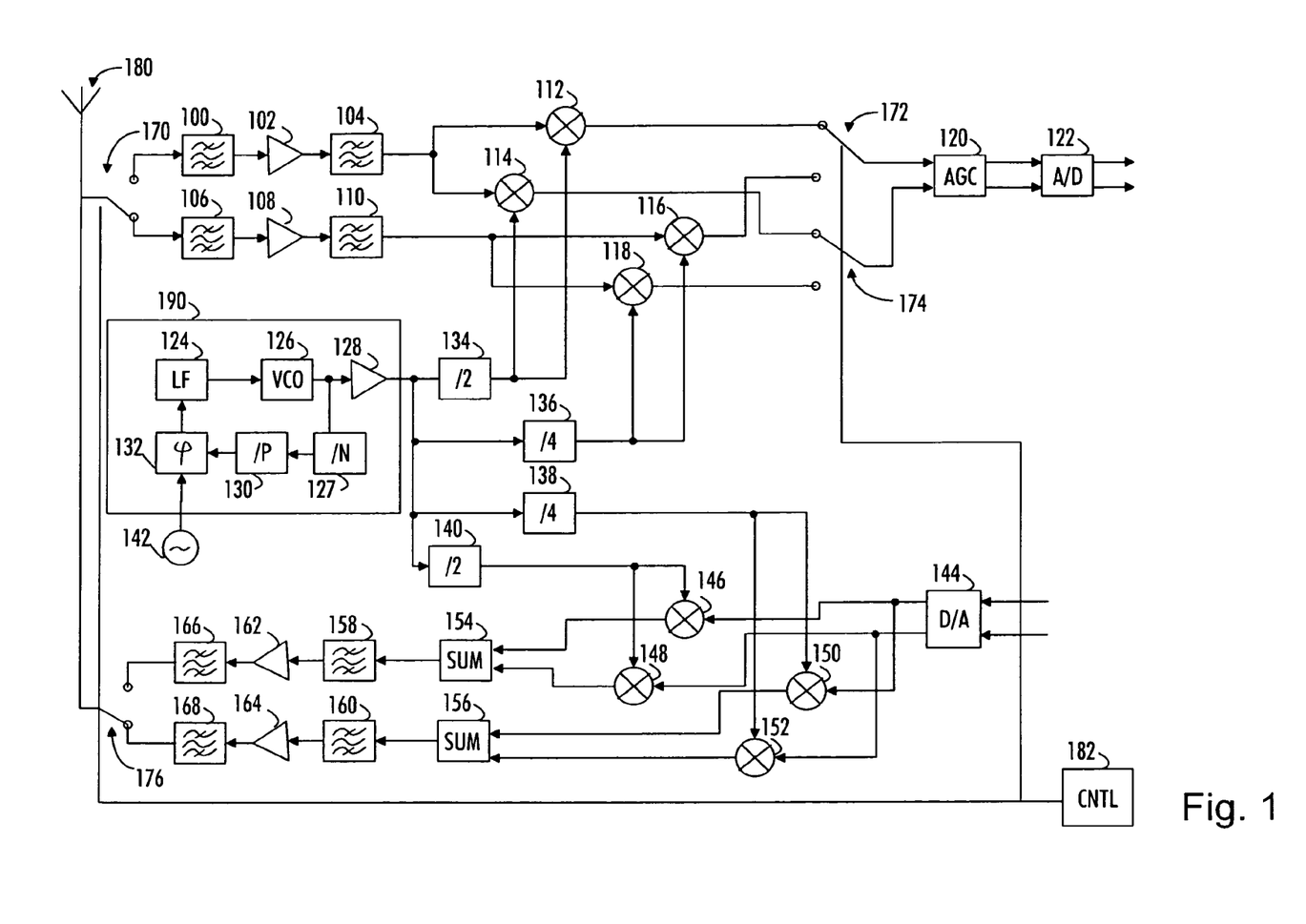
FIG. 1 illustrates a diagram of a direct conversion radio transceiver to which embodiments of the invention may be applied.

With reference to FIG. 1, let us examine an example of a direct conversion radio transceiver to which embodiments of the invention can be applied. The radio transceiver may be, for example, a mobile communication device, such as a cellular telephone, a personal digital assistant, etc. Naturally, other radio devices are possible. Let us first consider a direct conversion receiver structure of the transceiver. A radio signal is received through an antenna 180 and applied to a switch controlled by a frequency selection controller 182 which controls switches 170, 172, and 174 according to a transmission frequency of the received radio signal. The transmission frequency is typically negotiated in an establishment of a communication link or changed according to a predetermined pattern and is, thus, known to the controller 182. In other words, the controller 182 controls the switch 170 to connect the received radio signal to one of bandpass filters 100, 106. The bandpass filters 100, 106 remove undesired frequency components from the received radio signal and apply the filtered signal to a low-noise amplifier 102, 108, respectively.

After amplification, the signal is once again bandpass filtered in one of bandpass filters 104, 110 (according to the frequency selection). Then, the received radio signal is down-converted in frequency mixers 112 and 114 or 116 and 118. The received radio signal is applied to two frequency mixers to separate an in-phase (I) channel and a quadrature (Q) channel from the received radio signal. Before applying the radio signal to a quadrature channel frequency mixer, the radio signal may be delayed by 90 degrees with respect to the radio signal applied to an in-phase channel frequency mixer.

The frequency mixers 112 to 118 multiply the received radio signal with an oscillator signal having the same frequency as a carrier signal of the received radio signal. The oscillator signal may originate from a frequency synthesizer 190, which may be a phase locked loop (PLL), for example. A voltage-controlled oscillator (VCO) 126 may provide an oscillator signal to an amplifier 128 acting as a buffer and to a frequency pre-divider 127 included in the PLL. The frequency pre-divider 127 may divide the frequency of the oscillator signal by a fixed division factor N, and output the frequency-divided oscillator signal to a programmable divider 130. The programmable divider 130 divides the frequency of the oscillator signal by a variable factor P selected according to the output frequency of the VCO 126, and outputs the frequency divided oscillator signal to a phase comparator 132. The phase comparator 132 compares the phase of the oscillator signal provided by the divider 130 with a reference oscillator signal provided by a crystal oscillator 142, for example, and outputs the phase difference signal to a loop filter 124. The loop filter 124 filters the phase difference signal and supplies the signal as a control signal to the voltage controlled oscillator 126, which then adjusts the frequency of the oscillator signal according to the control signal.

An amplified oscillator signal provided by the amplifier 128 is fed to frequency dividers 134, 136, 138, and 140. Frequency dividers 134 and 140 divide the frequency of the oscillator signal by two, and frequency dividers 136 and 138 divide the frequency of the oscillator signal by four. The frequency divider 134 outputs the frequency-divided oscillator signal to the frequency mixers 112 and 114, and the frequency divider 136 outputs the frequency-divided oscillator signal to the frequency mixers 116 and 118. Then, switches 172 and 174 select outputs of either frequency mixers 112 and 114 or frequency mixers 116 and 118 under the control of the controller 182 selecting the operating frequency, as described above. As a result, the received radio signal is downconverted into an I channel baseband signal and a Q channel baseband signal. The base band signals are then fed to an automatic gain control amplifier 120 amplifying the signals, and then the analog baseband signals are converted into a digital form in an analog-to-digital converter 122. Then, the digital baseband signals are output for digital signal processing operations, such as demodulation and detection.

In a transmitter part of the radio transceiver, a digital-to-analog converter 144 converts a digital transmission signal comprising an I channel transmission signal and a Q channel transmission signal into analog wave-forms. The converter 144 outputs the I channel analog signal to frequency mixers 146 and 150 and the Q channel analog signal to frequency mixers 148 and 152. The frequency mixers 146 and 148 multiply the analog signals with the oscillator signal provided by the divide-by-two divider 140, and the frequency mixers 150 and 152 multiply the analog signals with the oscillator signal provided by the divide-by-four divider 138. The up-converted I and Q channel signals are then applied to adders 154 and 156 which sum the I channel and Q channel signals together. Then the summed signals are bandpass filtered in bandpass filters 158 and 160, amplified in amplifiers 162 and 164 and once again bandpass filtered in bandpass filters 166 and 168. The switch 176 selects one of the transmitter branches according to the transmission frequency to be used in the transmission of the signal. The switch 176 is controlled by the frequency selection controller 182. The selected transmission radio signal is then applied to the antenna 180.

In order to avoid unnecessary operations and minimize power consumption in the transmitter part, the frequency selection controller 182 may turn off the transmitter branch related to the transmission frequency not to be used in the transmission. For example, if a higher transmission frequency is to be used in the transmission, the frequency selection controller 182 may shut down frequency mixers 150 and 152, adder 156, and amplifier 164.

Figure 2:
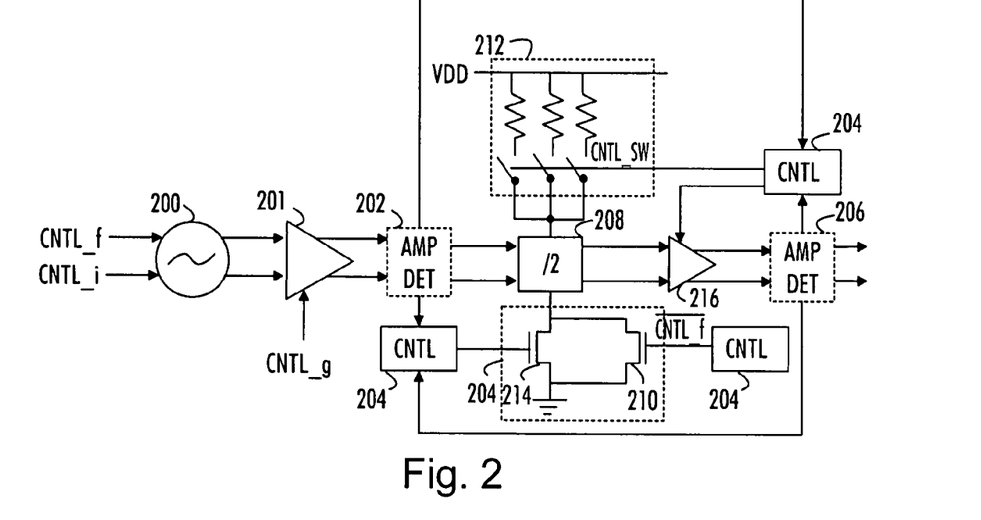
FIG. 2 illustrates a structure of a frequency divider circuitry according to an embodiment of the invention.

FIG. 2 illustrates a frequency divider circuit 134 according to an embodiment of the invention. The frequency divider may be any of the frequency dividers described above in conjunction with FIG. 1. In other words, the frequency divider may be included in the frequency synthesizer 190, e.g. a frequency divider of the PLL, or it may be a frequency divider external to the frequency synthesizer 190. In addition to the frequency divider, FIG. 2 illustrates an oscillator signal generator 200 (which may be the VCO 126, for example) and an amplifier 201 (which may be the buffering amplifier 128). The oscillator signal generator 200 may be controlled by control signals CNTL_f and CNTL_i controlling the frequency of the oscillator signal generator. One of the control signals, e.g. CNTL_f, may configure parameters of a resonance circuit included in the oscillator signal generator 200 to resonate at a desired frequency. This control signal CNTL_f may remain substantially fixed until the operating frequency of the radio transceiver is changed. Another control signal CNTL_i may be a control signal of the phase locked loop fine-tuning the frequency of an output signal of the oscillator signal generator 200. This control signal CNTL_i may vary according to the fluctuation in the frequency of the output signal of the oscillator signal generator 200.

Gain of the buffering amplifier 201 is controlled by a gain control signal CNTL_g applied to the buffering amplifier 201 from a control unit. The output of the buffering amplifier 201 may be applied to a frequency divider according to an embodiment of the invention either directly or through a first amplitude detector 202. The first amplitude detector 202 is illustrated in greater detail later. A circuit of the frequency divider according to this embodiment includes the actual frequency divider 208 carrying out the frequency division for the input oscillator signal. Additionally, the circuit includes components affecting properties and performance of the frequency divider. The circuit may include an impedance circuit 212 comprising a plurality of passive components selectable to be connected to the frequency divider 208. The passive components may be arranged into parallel branches, wherein each branch includes a switch used for selecting the branch to be connected to the frequency divider 208. The switches may be operated by a control unit 204. One end of the impedance circuit may be connected to an operating voltage VDD, while the other end may be connected to the actual frequency divider 208. One or more of the parallel branches may be selected to be connected to the frequency divider by closing appropriate switches with a control signal CNTL_SW, thereby affecting circuit configuration and, particularly, output impedance of the frequency divider. FIG. 2 illustrates the impedance circuit 212 including only resistances but the impedance circuit may also include other passive components such as capacitances and/or inductances.

The frequency divider circuit may further comprise a biasing circuit including biasing transistors 214 and 210 controlled according to control signals provided by the control unit 204. One end of the biasing circuit may be connected to the ground or to a negative operating voltage, while the other end of the biasing circuit may be connected to the actual frequency divider 208. The control unit 204 may apply to a gate electrode of a first biasing transistor 214 a constant bias voltage and either activate or disable a second biasing transistor 210 with another control signal applied to the gate electrode of the second biasing transistor 210. In an embodiment, the control signal applied to the gate electrode of the second biasing transistor 210 is selected according to the control signal CNTL_f applied to the oscillator signal generator 200. In other words, the biasing circuit is configured according to the properties of the input signal to be frequency-divided. The level of the biasing voltages applied to the biasing transistors 214 and 210 may also be a function of the control signal(s) applied to the oscillator signal generator 200. Different configurations of the biasing circuit change the circuit configuration and, particularly, biasing voltage of the frequency divider.

Additionally, the circuit configuration of the frequency divider circuit according to an embodiment of the invention may be affected by arranging an adjustable voltage regulator (not shown in FIG. 2) to provide the operating voltage VDD. The adjustable voltage regulator may be controlled by the control unit 204.

As discussed above, the circuit configuration of the frequency divider may be changed according to a change in a signal processed by the frequency divider, i.e. according to the signal to be frequency divided. It has been discovered that the properties of the input oscillator signal, e.g. frequency, affect the performance of the frequency divider. In fact, the performance of a frequency divider having a fixed circuit configuration may be close to ideal when the input signal has a given frequency but deteriorate drastically upon a change in the frequency of the input oscillator signal.

This problem may be overcome by providing a frequency divider including at least one frequency divider cell having a circuit configuration changeable according to properties of the input oscillator signal frequency-divided in the frequency divider. FIG. 2 illustrates a frequency divider including one frequency divider cell performing a frequency division by a factor of two. In another embodiment, the number of frequency divider cells included in the frequency divider may be higher than one, and the circuit configuration of the frequency divider cells may be changed independently. The frequency divider cells may be arranged in series and/or in parallel depending on the design of the frequency divider. Frequency dividers considered in this description are considered to have a single frequency divider cell for the sake of simplicity, but one skilled in the art may easily implement the invention in frequency dividers having more than one frequency-divider cells having separate circuit configurations changeable during the operation of the frequency divider.

In an embodiment, the circuit configuration of the frequency divider is changed according to the current configuration of the oscillator signal generator providing the oscillator signal input to the frequency divider. In that case, the circuit configuration of the frequency divider is also selected according to properties of the input oscillator signal. Circuit configurations associated with different properties of the input oscillator signal may be determined in a design, production, and/or testing phase of the frequency divider and/or the radio transceiver and stored into a memory unit (not shown), from which the control unit 204 may select an appropriate circuit configuration.

In practice, the control unit 204 may first determine an operating frequency of the radio transceiver from transmission and/or reception parameters allocated for the radio transceiver. The transmission parameters may be pre-stored into the memory unit of the radio transceiver or communicated to the radio transceiver. When the operating frequency has been determined, the control unit 204 may apply to the oscillator signal generator 200 a control signal (CNTL_f) corresponding to the determined operating frequency. The control signal CNTL_f may also be referred to as a power-down signal, which is a common term in the art. The radio transceiver may have a plurality of oscillator signal generators activated or disabled with the power-down signal. The control signal CNTL_F applied to the oscillator signal generator 200 causes the oscillator signal generator 200 to generate an oscillator signal which is further processed into an oscillator signal used in frequency conversion between operating radio frequency and base band (or intermediate band).

In another embodiment, the control unit 204 may change the circuit configuration of the frequency divider in response to a change in a communication protocol of the radio device, wherein each communication protocol defines communication parameters for a different telecommunication system. The radio device may be a multi-mode radio device supporting communication with multiple mobile telecommunication systems with different radio access specifications. Accordingly, the circuit configuration of the frequency divider may be selected according to the current transmission mode, i.e. according to the radio access specifications of a mobile telecommunication system with which the radio device is currently communicating. In conjunction with selecting the control signal applied to the oscillator signal generator 200, the control unit 204 selects one or more control signals to be applied to the frequency divider in order to select a circuit configuration corresponding to the operating frequency. In practice, the control unit 204 may select a control signal to be applied to the impedance circuit 212 of the frequency divider in order to selectively close and/or open one or more of the switches of the parallel branches and, thereby, select output impedance most optimal for the operating frequency. In other words, the control unit 204 selectively controls the impedance circuit to couple or disconnect impedance components of the impedance circuit to or from the frequency divider circuitry. Additionally, the control unit 204 may select a control signal to be applied to the biasing circuit of the frequency divider. As a consequence, the control unit 204 may select a biasing current for the frequency divider by activating or disabling one or more of the biasing transistors included in the biasing circuit, thereby selecting a biasing current most optimal for the operating frequency. Moreover, the control unit 204 may select a control signal to be applied to the adjustable voltage regulator (not shown) in order to select the operating voltage most optimal for the operating frequency. Then, the control unit 204 may apply the control signal(s) to the frequency divider so as to select a circuit configuration most optimal for the operating frequency, i.e. the frequency of the input oscillator signal.

As mentioned above, circuit configuration parameters of the frequency divider may be predetermined and stored for each frequency of the input oscillator signal and/or for each configuration of the oscillator signal generator 200. As a general rule of how to select the circuit configuration, a few examples are presented. The biasing current of the frequency divider may be increased in proportion to an increase in the input oscillator signal. Accordingly, more biasing transistors included in the biasing circuit may be activated as the frequency of the input oscillator signal increases. Similarly, the operating voltage of the frequency divider may be changed in proportion to the change in the input oscillator signal. In other words, the control unit 204 may control the adjustable voltage regulator to increase the operating voltage in proportion to an increase in the frequency of the input oscillator signal. Correspondingly, the control unit 204 may control the adjustable voltage regulator to decrease the operating voltage in proportion to a decrease in the frequency of the input oscillator signal. Output impedance of the frequency divider may be changed such that the impedance circuit is in resonance on the operating frequency. The components of the impedance circuit may be selected according to the operating frequencies supported by the radio transceiver including the frequency divider. In other words, the components of the impedance circuit may be selected in such a manner that the impedance circuit has a resonance frequency on the operating frequencies supported by the radio transceiver.

Additionally, output buffering of the frequency divider, i.e. amplification of the frequency-divided oscillator signal, may be changed in proportion to the changes in the frequency of the input oscillator signal. Accordingly, a buffering amplifier 216 may be provided at the output of the frequency divider. The gain of the buffering amplifier may be controlled by the control unit 204. The control unit 204 may control the buffering amplifier 216 to increase the gain in proportion to the increase in the frequency of the input oscillator signal. In practice, buffering inverters having larger gains may be used for oscillator signals having higher frequencies. In an embodiment, a plurality of buffering inverters are provided in the buffering amplifier 216. Each buffering inverter may be controlled by a dedicated switch which may be implemented by a switching transistor. The number of buffering inverter stages coupled to the frequency divider circuitry may be selected by activating a determined number of buffering inverters, i.e. closing the determined number of switches. The more buffering inverters are coupled to the frequency divider circuitry, the higher is the gain of the buffering amplifier 216. The switches may be controlled by one or more power-down signals associated with the power-down signal applied to the oscillator signal generator 200. In another embodiment, each buffering inverter has a dedicated voltage regulator controlled by a control signal provided by the control unit 204. The control signals input to the regulators may be power-down signals applied as a function of the power-down signal applied to the oscillator signal generator 200.

The control unit 204 may determine the circuit configuration of the frequency divider according to the parameters predetermined for the determined operating frequency, as described above. In another embodiment, an amplitude detection unit 202 and/or 206 is provided at an input and/or output of the frequency divider. In FIG. 2, a first amplitude detection unit 202 is arranged at the input of the frequency divider, while a second amplitude detection unit 206 is arranged at an output of the frequency divider. The first amplitude detection unit 202 is configured to detect amplitude (or swing) of the input oscillator signal to be frequency-divided in the frequency divider. The second amplitude detection unit 206 is configured to detect the amplitude (or swing) of an output oscillator signal of the frequency divider. The amplitude detection units 202 and 206 may be configured to apply the detected amplitude information to the control unit 204 to be used in selection of the circuit configuration of the frequency divider.

The control unit 204 may compare the received amplitude information with stored amplitude thresholds or desired ranges and decide to take appropriate measures in order to ensure efficiency of the frequency divider. For example, if the received amplitude information indicates too low an amplitude level, i.e. low swing of oscillator signal, the control unit 204 may determine to increase the biasing current or the operating voltage of the frequency divider. On the other hand, if the received amplitude information indicates that the amplitude level is too high, causing excessive power consumption, for example, the control unit 204 may determine to decrease the biasing current, operating voltage, or output buffering of the frequency divider circuit or disable determined biasing transistors or buffering inverters of the frequency divider. Accordingly, the control unit 204 may select for the frequency divider a circuit configuration which compensates for too high or too low a swing in the input and/or output oscillator signal of the frequency divider.

Figure 3:
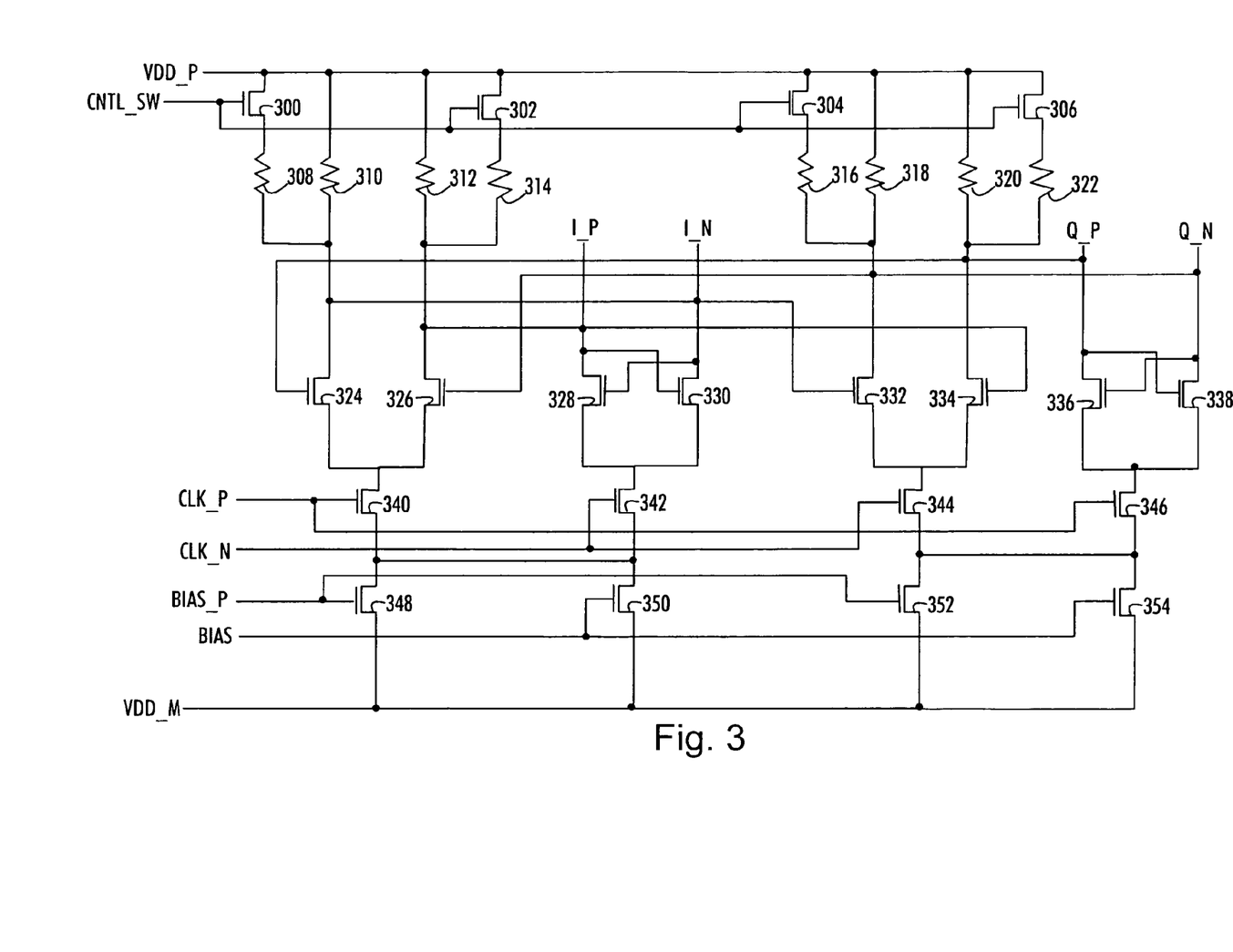
FIG. 3 illustrates a detailed circuit diagram of the frequency divider circuitry according to an embodiment of the invention.

FIG. 3 illustrates a detailed circuit diagram of the frequency divider according to an embodiment of the invention. FIG. 3 illustrates four transistor pairs, wherein transistors 324 and 326 form a first gate pair, transistors 328 and 330 form a first latch pair, transistors 332 and 334 form a second gate pair, and transistors 336 and 338 form a second latch pair. These transistor pairs form the actual frequency divider 208 illustrated in FIG. 2. The transistors illustrated in FIG. 3 are considered as NMOS transistors, but utilization of other types of transistors is naturally an alternative solution. A structure performing frequency division by a factor two is used here for the sake of simplicity of description. The invention may, however, be applied to frequency dividers having an arbitrary frequency division factor.

Impedance components 308 to 322 and switches 300 to 306 form the impedance circuit 212. The impedance components 308 to 322 are arranged into separate branches so as to provide flexibility for the selection of the output impedance of the frequency divider. A first impedance 308 and a second impedance 310 are arranged in parallel and connected from one end to each other and to a drain electrode of the transistor 324 of the first gate pair. The second impedance 310 is coupled from the other end to the positive operating voltage VDD_P. The other end of the first impedance 308 is coupled to the positive operating voltage VDD_P through a first switch 300 implemented by a transistor controlled with a switch control signal CNTL_SW. Accordingly, the second impedance 310 is always connected to the frequency divider circuitry, while the first impedance is connected selectively according to whether the first switch 300 is open or closed.

The other impedances are arranged in a similar way. With respect to a third impedance 312 and a fourth impedance 314, first ends of the impedances are connected to each other and to the drain electrode of the transistor 326 of the first gate pair, while the other ends of the impedances are connected to the positive operating voltage VDD_P. The fourth impedance 314 is connected to the positive operating voltage VDD_P through a second switch 302 closed under the control of the switch control signal CNTL_SW. With respect to a fifth impedance 316 and a sixth impedance 318, first ends of the impedances are connected to each other and to the drain electrode of the transistor 332 of the second gate pair, while the other ends of the impedances are connected to the positive operating voltage VDD_P. The fifth impedance 316 is connected to the positive operating voltage VDD_P through a third switch 304 closed under control of the switch control signal CNTL_SW. With respect to a seventh impedance 320 and an eighth impedance 322, first ends of the impedances 320 and 322 are connected to each other and to the drain electrode of the transistor 334 of the second gate pair, while the other (second) ends of the impedances 320 and 322 are connected to the positive operating voltage VDD_P. The eighth impedance 322 is connected to the positive operating voltage VDD_P through a fourth switch 306 closed under the control of the switch control signal CNTL_SW. The impedance circuit may naturally have another configuration. The function of the impedance circuit is to provide the frequency divider circuit with adjustable output impedance which can be adjusted rapidly during the operation of the frequency divider.

The drain electrode of the transistor 324 of the first gate pair is further connected to the drain electrode of the transistor 330 of the first latch pair and to a gate electrode of the transistor 332 of the second gate pair. Correspondingly, the drain electrode of the transistor 326 of the first gate pair is further connected to the drain electrode of the transistor 328 of the first latch pair and to the gate electrode of the second gate pair. The gate electrode of the transistor 324 of the first gate pair is coupled to drain electrodes of the transistor 334 of the second gate pair and transistor 336 of the second latch pair. The gate electrode of the transistor 326 of the first gate pair is coupled to the drain electrodes of the transistor 332 of the second gate pair and the transistor 338 of the second latch pair. Source electrodes of the each pair of electrodes are coupled together, as illustrated in FIG. 2, i.e. sources of the first gate pair are coupled together, sources of the first latch pair are coupled together, etc.

The drain electrode of the transistor 328 of the first latch pair is coupled to the gate electrodes of the transistor 330 of the first latch pair and the transistor 334 of the second gate pair. Similarly, the drain electrode of the transistor 330 of the first latch pair is coupled to the gate electrodes of the transistor 328 of the first latch pair and the transistor 332 of the second gate pair. The drain electrode of the transistor 332 of the second gate pair is connected to the drain electrode of the transistor 338 of the second latch pair, and the drain electrode of the transistor 334 of the second gate pair is connected to the drain electrode of the transistor 336 of the second latch pair. The drain electrode of the transistor 336 of the second latch pair is coupled to the gate electrode of the transistor 338 of the second latch pair, and the drain electrode of the transistor 338 of the second latch pair is coupled to the gate electrode of the transistor 336 of the second latch pair.

The source electrodes of the first gate pair are connected to the drain electrode of a first transistor 340, the source electrodes of the first latch pair are connected to the drain electrode of a second transistor 342, the source electrodes of the second gate pair are connected to the drain electrode of a third transistor 344, and the source electrodes of the second latch pair are connected to the drain electrode of a fourth transistor 346. A positive component of the input oscillator signal CLK_P applied to the frequency divider is coupled to the gate electrodes of the first transistor 340 and the fourth transistor 346, while a negative component of the input oscillator signal CLK_N is coupled to the gate electrodes of the second transistor 342 and the third transistor 344. Accordingly, the input oscillator signal is depicted in a differential mode. The source electrodes of the first and the second transistor 340 and 342 are coupled together, as are the source electrodes of the third and the fourth transistor 344 and 346.

A positive in-phase oscillator signal is obtained from the drain electrode of the transistor 328 of the first latch pair, a negative in-phase oscillator signal is obtained from the drain electrode of the transistor 330 of the first latch pair, a positive quadrature oscillator signal is obtained from the drain electrode of the transistor 336 of the second latch pair, and a negative quadrature oscillator signal is obtained from the drain electrode of the transistor 338 of the second latch pair.

The source electrodes of the first and the second transistor 340 and 342 are coupled to the drain electrode of a first biasing transistor 348 and the drain electrode of a second biasing transistor 350, while the source electrodes of the third and the fourth transistor 344 and 346 are coupled to the drain electrode of a third biasing transistor 352 and the drain electrode of a fourth biasing transistor 354. The source electrodes of the biasing transistors 348 to 354 are connected to a negative operating voltage VDD_M.

A constant bias voltage BIAS may be applied to the gate electrodes of the second and the fourth biasing transistor 350 and 354, while a bias bypass voltage BIAS_BP may be applied to the gate electrodes of the first and the third biasing transistor 348 and 352. Accordingly, the second and the fourth biasing transistors 350 and 354 may constantly provide the first gate and latch pairs and the second gate and latch pairs with biasing current. In other words, the second biasing transistor 350 may constantly provide the first gate and latch pairs with the biasing current, and the fourth biasing transistor 354 may constantly provide the second gate and latch pairs with the biasing current. If necessary, the biasing current may be increased by activating at least one of or both first and third biasing transistor 348 and 352 by applying to the gates of the first and third biasing transistor 348 and 352 the bias bypass voltage BIAS_BP activating the biasing transistors 348 and 352 and enabling the flow of current between the main electrodes (source and drain) of the biasing transistors 348 and 352. Actually, the first and the third biasing transistor 348 and 352 function as bias bypass transistors used to increase the bias current in the frequency divider circuit by arranging the voltage in the source electrodes of the first to fourth transistor 340 to 346 to be as close to the negative operating voltage VDD_M as possible. This is achieved by bypassing the second and fourth biasing transistor 350 and 354 with the first and third biasing transistor 348 and 352.

Figure 4:
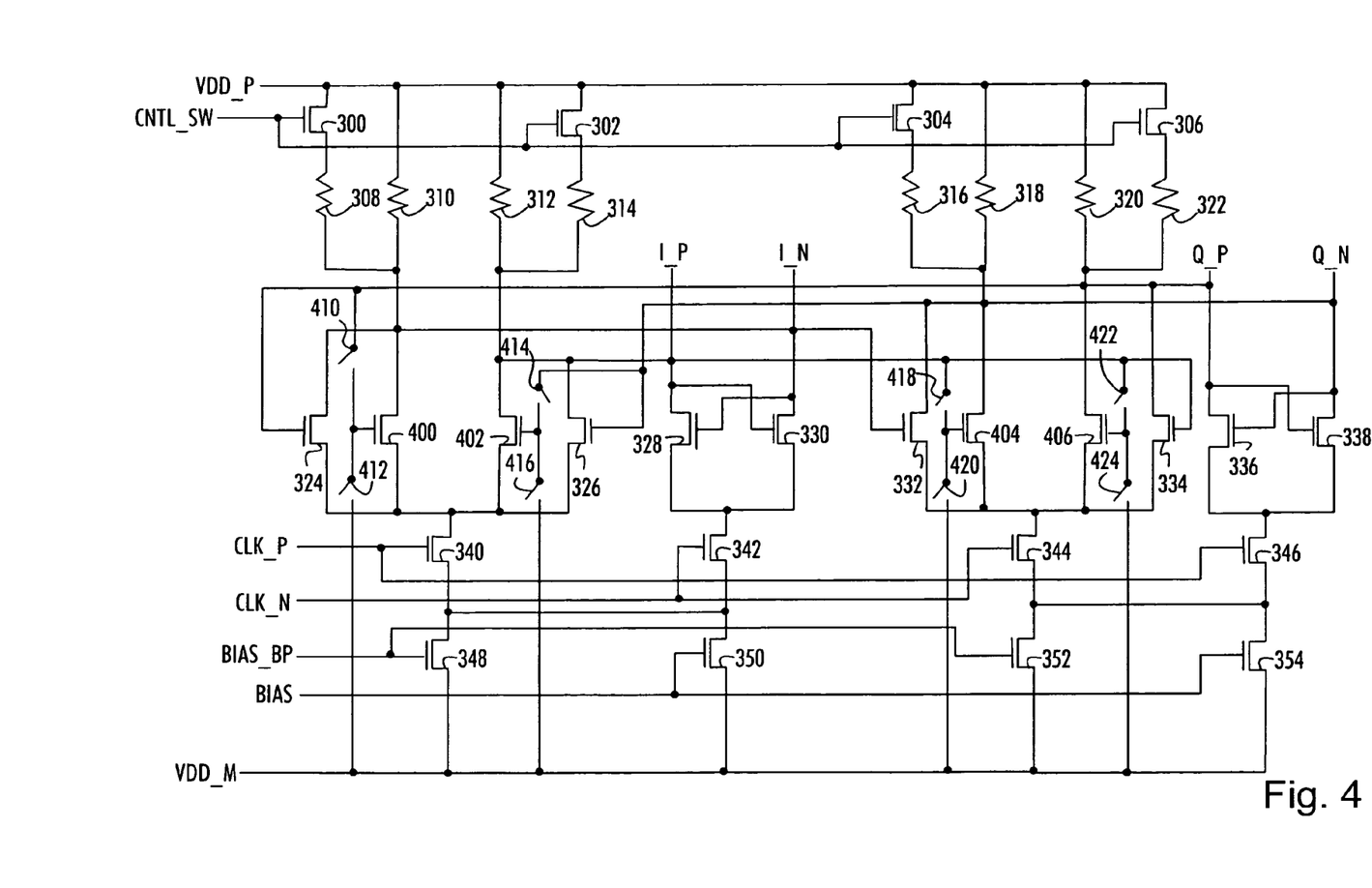
FIG. 4 illustrates a detailed circuit diagram of the frequency divider circuitry according to another embodiment of the invention.

FIG. 4 illustrates another embodiment of the circuit diagram of the frequency divider. The components having the same reference numerals as in FIG. 3 represent the same components. A difference between the embodiment of FIG. 3 and FIG. 4 may be found in the actual frequency divider and, particularly, in the first and the second gate pairs. In the embodiment of FIG. 4, there is provided an additional transistor in parallel with each transistor of a given gate pair. The number of transistor pairs to be connected to the circuitry in each gate pair may be selectable by closing appropriate switches.

Let us first consider the first gate pair. The first gate pair includes the same transistors 324 and 326 as in the embodiment illustrated in FIG. 3. Additionally, a transistor 400 is arranged in parallel with the transistor 324. That is, the source electrodes as well as the drain electrodes of the transistors 324 and 400 are connected to each other. Additionally, the gate electrodes of the transistors 324 and 400 are coupled to each other but through a first gate switch 410. The first gate switch 410 connects or separates the gate electrodes of the transistors 324 and 400. A second gate switch 412 is also connected to the gate electrode of the transistor 400. The second gate switch is used to connect the transistor 400 to the negative operating voltage VDD_M. In other words, the first gate switch 410 and the second gate switch 412 are used to connect the transistor 400 to the frequency divider circuitry or separate it from the circuitry. The gate switches may be controlled by the control unit 204.

Similarly, a transistor 402 is arranged in parallel with the transistor 326 in the first gate pair. That is, the source electrodes of the transistors 326 and 402 are connected to each other, as are the drain electrodes connected to each other. The gate electrodes are coupled to each other through a third gate switch 414, while the gate electrode of the transistor 402 is coupled to the negative operating voltage through a fourth gate switch 416.

The second gate pair may have the structure similar to that of the first gate pair. In other words, the transistors 332 and 404 may be arranged in parallel, and the gate electrode of the transistor 404 may be connected to or separated from the circuitry by operating gate switches 418 and 420 arranged in a manner similar to the gate switches 410 and 412. Moreover, transistors 334 and 406 may be arranged in parallel, and the gate electrode of transistor 406 may be connected to or separated from the circuitry by operating gate switches 422 and 424 arranged in a manner similar to the gate switches 414 and 416.

In the embodiment of FIG. 4, the number of transistors in the actual frequency divider may be changed according to the properties of the input oscillator signal. The gate switches 410 to 424 may be controlled by the control unit 204, as described above with respect to selecting the circuit configuration for the frequency divider. An increase in the number of transistors in the actual frequency divider enables the frequency divider to produce a signal with a higher swing to a higher load, which is the load of the actual frequency divider plus the load of the impedance circuit, i.e. the combined load of the components of the impedance circuit that are connected to the actual frequency divider currently. An arbitrarily high increase in the number of transistors in the actual frequency divider may result in parasitic capacitances which may degrade the performance of the frequency divider in some cases.

In an embodiment, the actual frequency divider 208 is implemented digitally with D flip-flops, for example. In this embodiment, it may suffice to change only the operating voltage of the frequency divider, thereby influencing the output voltage level of the frequency divider.

In another embodiment, the actual frequency divider 208 has been implemented by three-state inverters. As in the previous embodiment, it may suffice to change only the operating voltage of the frequency divider. Additionally, a plurality of such frequency dividers (referred to as frequency divider sub-units here) may be provided in parallel between the input and the output of the frequency divider, wherein each frequency divider sub-unit is implemented by three-state inverters and optimized for different frequencies. Each frequency divider sub-unit may be controlled by a dedicated power-down signal. A frequency divider sub-unit to be used in the frequency division of the input oscillator signal may be selected by activating the desired frequency divider sub-unit with the power-down signal provided by the control unit 204. The control unit 204 may provide the power-down signal as a function of the power-down signal applied to the oscillator signal generator.

Figure 5:
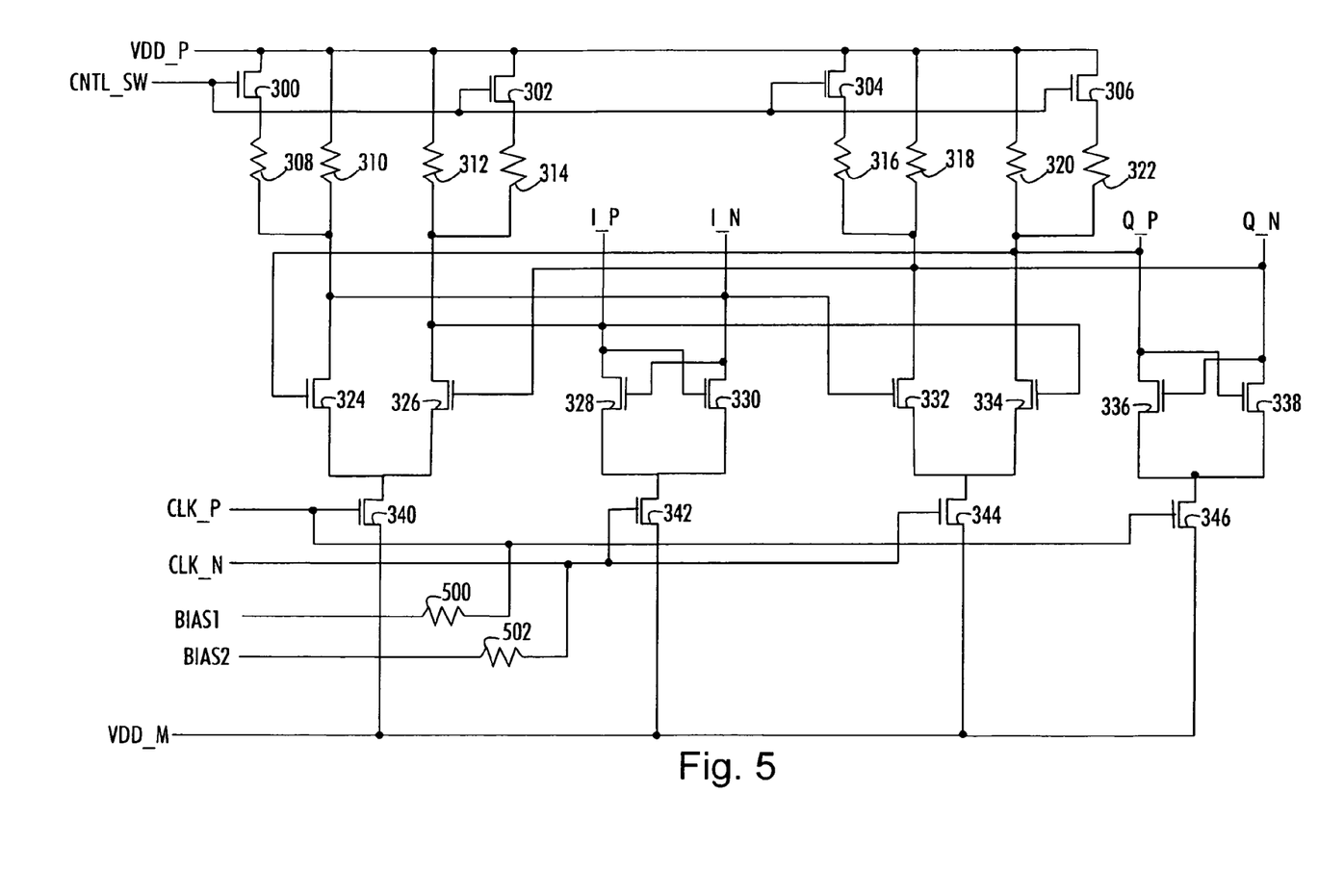
FIG. 5 illustrates a detailed circuit diagram of the frequency divider circuitry according to yet another embodiment of the invention.

FIG. 5 illustrates another embodiment of the frequency divider. This embodiment is based on the frequency divider of FIG. 3, but it may equally be applied to the frequency divider of FIG. 4. In this embodiment, the biasing transistors 348 to 354 have been omitted, and first-to-fourth transistors 340 to 346 also function as the biasing transistors. Accordingly, bias voltages BIAS1 and BIAS2 are applied to the gates of the first to fourth transistors 340 to 346 through a first resistance 500 and a second resistance 502, respectively. The bias voltages BIAS1 and BIAS2 may be the same bias voltages or different bias voltages, depending on the implementation. In more detail, a first bias voltage BIAS1 may be applied to the gate of the first transistor 340 and the fourth transistor 346 through the first resistance 500. Similarly, a second bias voltage BIAS2 may be applied to the gate of the second transistor 342 and the third transistor 344 through the second resistance 502. The idea is to bring the bias voltages to the gates of the same transistors to which the input oscillator signals are applied. Accordingly, the use of separate biasing transistors may be avoided, thus reducing the complexity of the frequency divider avoiding losses in the swing of the oscillator signal due to the additional transistors.

Figure 6:
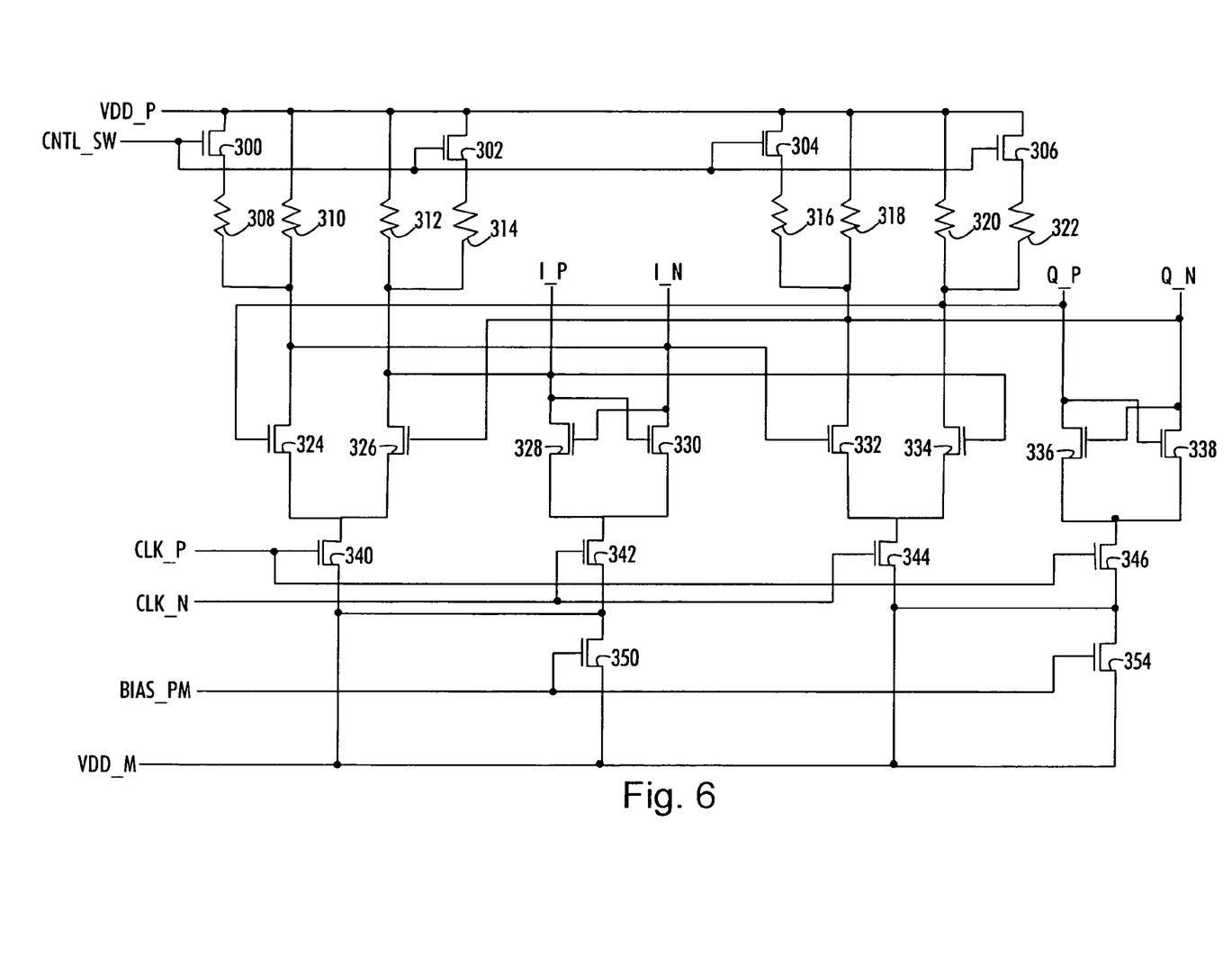
FIG. 6 illustrates a detailed circuit diagram of the frequency divider circuitry according to still another embodiment of the invention.

FIG. 6 illustrates yet another embodiment of the frequency divider. This embodiment is based on the frequency divider of FIG. 3, but it may equally be applied to the frequency divider of FIG. 4. In the embodiments of FIG. 3 and 4, the idea is to provide a bypass route around the biasing transistors 350 and 354 to induce a source electrode voltage close to the negative operating voltage VDD_M in the transistors 340 to 346. The same effect may be achieved by removing the bypassing biasing transistors, i.e. the first and third biasing transistor 348 and 352, and by applying a bias voltage BIAS_PM to the gate electrodes of the second and fourth biasing transistor 350 and 354. The bias voltage BIAS_PM may be adjusted between the operating voltages VDD_P and VDD_M under the control of the control unit 204, thereby providing the frequency divider with a bias voltage between the minimum bias voltage (when BIAS_PM=VDD_P) and maximum bias voltage (when BIAS_PM=VDD_M).

Figure 7:
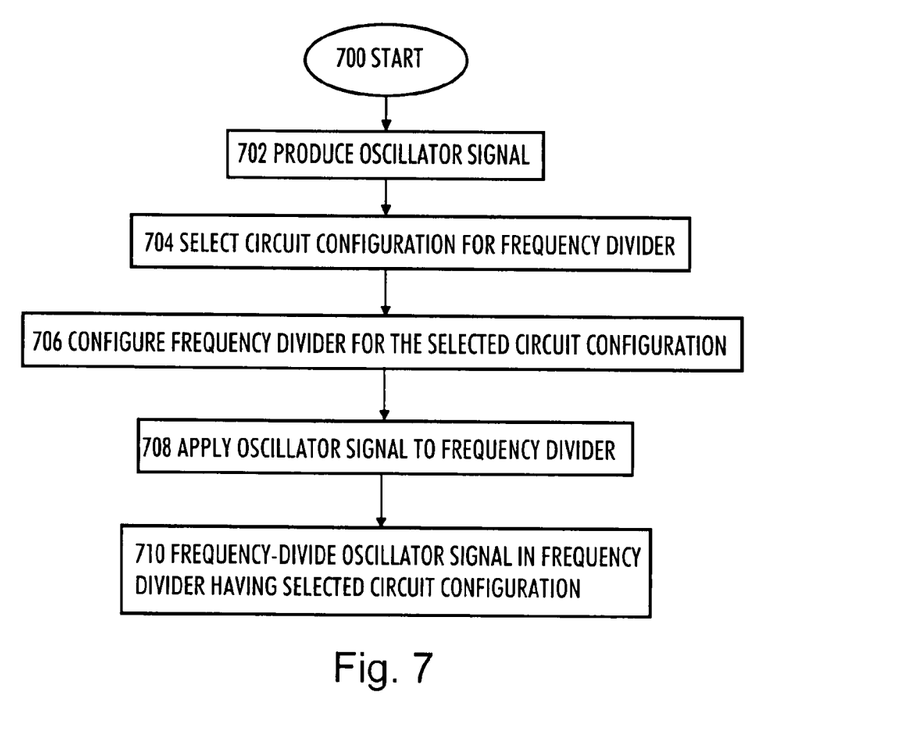
FIG. 7 is a flow diagram describing a process for changing the circuit configuration of a frequency divider according to an embodiment of the invention.

FIG. 7 is a flow diagram illustrating a process for selecting a circuit configuration for the frequency divider according to an embodiment of the invention. The process may be implemented in the radio transceiver discussed above. At least a portion of the process may be carried out in the control unit 204. The process starts in block 700. In block 702, an oscillator signal is produced in an oscillator signal generator under the control of the control unit 204. The control unit 204 may select a suitable oscillator signal generator and disable other oscillator signal generators included in the radio transceiver with a power-down signal. Additionally, the control unit 204 may tune the selected oscillator signal generator to generate the oscillator signal having a desired frequency.

In block 704, a circuit configuration is selected for a frequency divider configured to frequency-divide the oscillator signal produced in block 702. The control unit 204 may select the circuit configuration on the basis of the properties of the oscillator signal produced in block 702, e.g. according to the configuration of the oscillator signal generator. Selecting the circuit configuration of the frequency divider may include selecting parameters for at least one of the following: output impedance, bias current, operating voltage(s), degree of output buffering of the frequency divider.

When the circuit configuration parameters have been selected for the frequency divider, the frequency divider is configured to implement the selected circuit configuration in block 706. This may be carried out by the control unit 204 applying appropriate control signals to the frequency divider.

When the frequency divider has been configured to have the desired configuration, the oscillator signal is applied to the frequency divider in block 708, and the oscillator signal is frequency-divided in the frequency divider in block 710.

The operation of the control unit 204 may be defined by a computer program executed in the control unit 204. The computer program may comprise instructions controlling the control unit 204 to perform at least some of the steps illustrated in the flow diagram of FIG. 5 and in connection with FIG. 2. In other words, the computer program may configure the control unit 204 to change the circuit configuration of the frequency divider according to a change in a signal processed by the frequency divider.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims.

The invention claimed is:

1. A method, comprising:

providing a frequency divider comprising at least one frequency divider cell having a circuit configuration changeable during operation according to a determined criterion;

changing the circuit configuration of the at least one frequency divider cell by changing at least one of the following parameters of the at least one frequency divider cell according to a change in a signal processed by the frequency divider:

output impedance, bias current by coupling at least one active biasing transistor to the frequency divider cell circuitry, power supply voltage of the frequency divider, and size of an inverting buffer at an output of the at least one frequency divider cell;

detecting a level of at least one of an input signal and an output signal of the frequency divider; and changing the circuit configuration of the at least one frequency divider cell in response to the detected level or levels.

2. The method of claim 1, further comprising:
changing the circuit configuration of the at least one frequency divider cell when changing the signal processed by the frequency divider.

3. The method of claim 1, further comprising:
changing the output impedance of the at least one frequency divider cell by selectively coupling one or more impedance components to the frequency divider cell circuitry.

4. The method of claim 1, further comprising:
increasing the bias current in response to an increase in the frequency of the signal processed by the frequency divider.

5. The method of claim 1, further comprising:
dividing a frequency of an input oscillator signal by a determined frequency division factor in the frequency divider having a determined circuit configuration defined by the circuit configuration of the at least one frequency divider cell.

6. The method of claim 1, further comprising:
changing the circuit configuration of the at least one frequency divider cell by applying to the frequency divider at least one control signal selecting the circuit configuration of the at least one frequency divider cell.

7. The method of claim 1, wherein the frequency divider is configured to be used in a radio device, the method further comprising:
changing the circuit configuration of the at least one frequency divider cell in response to a change in the communication state of the radio device.

8. The method of claim 7, further comprising:
changing the circuit configuration of the at least one frequency divider cell in response to a change in the operating frequency of the radio device.

9. The method of claim 7, further comprising:
changing the circuit configuration of the at least one frequency divider cell in response to a change in a communication protocol of the radio device, wherein each communication protocol defines communication parameters of a different telecommunication system.

10. The method of claim 1, further comprising:
changing the circuit configuration of the at least one frequency divider cell in response to a change in a configuration of an oscillator signal generator configured to generate an oscillator signal input to the frequency divider.

11. The method of claim 10, further comprising:
changing the circuit configuration of the at least one frequency divider cell by applying to the frequency divider at least a portion of a control signal applied to the oscillator signal generator.

12. An apparatus, comprising:
a frequency divider configured to comprise at least one frequency divider cell having a circuit configuration changeable during operation in response to at least one control signal;
a controller configured to change the circuit configuration of the at least one frequency divider cell by changing at least one of the following parameters of the at least one frequency divider cell according to a change in an oscillator signal processed by the frequency divider:
output impedance,
bias voltage by coupling at least one active biasing transistor to the frequency divider circuitry,
power supply voltage of the frequency divider, and
size of an inverting buffer at the output of the frequency divider; and
an amplitude detection unit configured to detect the level of at least one of input signal and output signal of the frequency divider and to apply the detected level or levels to the controller, and the controller is further configured to change the circuit configuration of the at least one frequency divider cell in response to the detected level or levels.

13. The apparatus of claim 12, wherein the controller is configured to change the circuit configuration of the at least one frequency divider cell when changing the signal processed by the frequency divider.

14. The apparatus of claim 12, wherein the controller is configured to change the output impedance of the at least one frequency divider cell by selectively coupling one or more impedance components to the frequency divider circuitry.

15. The apparatus of claim 12, wherein the controller is configured to increase the bias current in response to an increase in the frequency of the signal processed by the frequency divider.

16. The apparatus of claim 12, wherein the controller is configured to change the circuit configuration of the at least one frequency divider cell by applying to the frequency divider at least one control signal selecting the circuit configuration of the at least one frequency divider cell.

17. The apparatus of claim 12, further comprising:
an oscillator signal generator configured to generate an oscillator signal input to the frequency divider, and the controller is configured to change the circuit configuration of the at least one frequency divider cell in response to a change in the configuration the oscillator signal generator.

18. The apparatus of claim 12, wherein the controller is further configured to change the circuit configuration of the at least one frequency divider cell by applying to the frequency divider at least a portion of the at least one control signal applied to the oscillator signal generator.

19. The apparatus of claim 12, wherein the apparatus is a radio apparatus.

20. The apparatus of claim 19, wherein the radio apparatus is configured to change the circuit configuration of the at least one frequency divider cell in response to a change in a communication state of the radio apparatus.

21. The apparatus of claim 20, wherein the radio apparatus is configured to change the circuit configuration of the at least one frequency divider cell in response to a change in a operating frequency of the radio apparatus.

22. The apparatus of claim 20, wherein the radio apparatus is configured to change the circuit configuration of the at least one frequency divider cell in response to a change in a communication protocol of the radio apparatus, wherein each communication protocol defines communication parameters of a different telecommunication system.

23. An apparatus, comprising:
frequency-dividing means comprising at least one frequency divider cell having a circuit configuration changeable during operation according to a determined criterion;
changing means for changing the circuit configuration of the at least one frequency-divider cell by changing at least one of the following parameters of the at least one frequency divider cell according to a change in a signal processed by the frequency-dividing means:
output impedance,
bias current by coupling at least one active biasing transistor to the frequency divider cell circuitry,
power supply voltage of the frequency divider, and
size of an inverting buffer at an output of the at least one frequency divider cell;
amplitude detection means for detecting the level of at least one of input signal and output signal of the frequency divider and for applying the detected level or levels to the controller, and the changing means further changes the circuit configuration of the at least one frequency divider cell in response to the detected level or levels.

24. A computer-readable program distribution medium encoding a computer program of instructions being configured to control a processor to perform:
selecting a circuit configuration of at least one frequency divider cell according to a change in a signal processed by a frequency divider comprising the at least one frequency divider cell having a circuit configuration changeable during operation;
configuring the at least one frequency divider cell to implement the selected circuit configuration by changing at least one of the following:
output impedance,
bias current by coupling at least one active biasing transistor to the frequency divider cell circuitry,
power supply voltage of the frequency divider, and
size of an inverting buffer at an output of the at least one frequency divider cell
detecting a level of at least one of an input signal and an output signal of the frequency divider; and
changing the circuit configuration of the at least one frequency divider cell in response to the detected level or levels.

* * * * *